United States Patent
Lo et al.

(10) Patent No.: US 7,192,176 B2
(45) Date of Patent: Mar. 20, 2007

(54) BACKLIGHT ASSEMBLY FOR A HAND-HELD LIQUID CRYSTAL DISPLAY

(75) Inventors: Chi-Chung Lo, Chang Hua Hsien (TW); Che-Chih Chang, Taichung (TW)

(73) Assignee: AU Optronics Corp., Hsinchu (TW)

( * ) Notice: Subject to any disclaimer, the term of this patent is extended or adjusted under 35 U.S.C. 154(b) by 303 days.

(21) Appl. No.: 11/008,970

(22) Filed: Dec. 13, 2004

(65) Prior Publication Data

US 2006/0006777 A1    Jan. 12, 2006

(30) Foreign Application Priority Data

Jul. 6, 2004   (TW) .............................. 93210650 U

(51) Int. Cl.
*F21V 7/04* (2006.01)
*G02B 6/42* (2006.01)
*H05K 1/00* (2006.01)

(52) U.S. Cl. .................. 362/612; 362/631; 362/633; 362/634; 361/749

(58) Field of Classification Search ................ 362/612, 362/288, 611, 613, 630, 631, 633, 634
See application file for complete search history.

(56) References Cited

U.S. PATENT DOCUMENTS

| | | | |
|---|---|---|---|
| 5,727,862 A * | 3/1998 | Wu .............................. 362/612 |
| 5,769,521 A * | 6/1998 | Osawa et al. ................ 362/612 |
| 6,068,381 A * | 5/2000 | Ayres .......................... 362/633 |
| 6,601,962 B1 * | 8/2003 | Ehara et al. ................. 362/612 |
| 6,629,765 B2 * | 10/2003 | Toyoda et al. .............. 362/612 |
| 6,719,436 B1 * | 4/2004 | Lin et al. ..................... 362/612 |
| 7,083,317 B2 * | 8/2006 | Higashiyama .............. 362/612 |
| 7,101,073 B2 * | 9/2006 | Li ................................ 362/631 |

* cited by examiner

*Primary Examiner*—Alan Cariaso
(74) *Attorney, Agent, or Firm*—Birch, Stewart, Kolasch & Birch, LLP

(57) ABSTRACT

A backlight assembly has an improvement on the structure for eliminating the gap between a light guide plate and a light source. The improvement includes a flexible printed circuit consisting of a body and a mount portion at each of its two ends. The mount portion has a substantially V-arm with a coupling hole. A mold frame has two couplers at its front surface and close to the coupling holes of the flexible printed circuit. The distance between the two coupling holes is substantially smaller than the distance between the couplers for generating deformation force. Consequently, when the two couplers are engaged with the coupling holes, the light source will be attached close to the light incident edge of the light guide plate, thereby eliminating the gap between the light guide plate and the light source.

12 Claims, 4 Drawing Sheets

BACKLIGHT ASSEMBLY FOR A HAND-HELD LIQUID CRYSTAL DISPLAY

BACKGROUND OF THE INVENTION

1. Field of the Invention

The invention relates to a backlight assembly for a hand-held liquid crystal display, and particularly to a backlight assembly that includes a light source mounted onto a flexible printed circuit.

2. Description of the Related Art

With the advancement of Thin Film Transistor Liquid Crystal Display (TFT LCD) technology, TFT LCD has gradually displaced the CRT display and become the mainstream of display technology. TFT LCD has many advantages, such as compact in size and low in power consumption and radiation. It has been widely applied to various types of electronic products, such as PDA, mobile phone, digital video camera, digital camera, notebook computer and television. Since TFT LCD relies on a light source for illumination, a backlight module with sufficient light source is usually provided to meet the requirement.

Refer to FIGS. 1A and 1B for a conventional backlight module for use on a hand-held liquid crystal display (LCD). It includes light guide plate 10, a mold frame 11 and a flexible printed circuit (FPC) 12.

The light guide plate 10 is made from translucent material, such as acrylic. It has a light exit surface 101 on its top side facing a panel (not shown), and a light incident edge 102 on one side adjacent to a light source 14 for guiding the light beam from the light incident edge 102 to the panel via the light exit surface 101. A reflector plate 13 is placed between the bottom surface of the light guide plate 10 and the mold frame 11 for enhancing the brightness by reflecting the reflected or refracted light beams.

The flexible printed circuit 12 has two light emitting diodes (LED) 14 mounted on its top surface serving as the light source. The LED 14 is a luminous semiconductor element made from GaP, GaAs, or the like. When receiving electric current from the flexible printed circuit 12, the LED 14 generates light by transforming the electric energy to optical energy. The number of the LED 14 used depends on actual application. It is not limited to the layout as shown in FIGS. 1A and 1B.

To increase light utilization of the light source, the LED 14 is supposed to attach to the light incident edge 102 of the light guide plate 10. However, in practice a gap may be formed between the light guide plate 10 and the LED 14 due to error tolerance designed for assembly. Consequently, if the gap A is greater than 0.5 mm, loss of the light source could exceed 10% or more. And, a bigger gap A will cause a greater loss of light.

Accordingly, there is a need in the LCD technology to improve the light utilization by eliminating the gap between the light guide plate and the LED.

SUMMARY OF THE INVENTION

Accordingly, it is an object of the present invention to provide a backlight assembly capable of improving light source utilization.

The backlight assembly of the invention is especially applicable to hand-held LCDs where its light source is mounted on a flexible printed circuit. The invention includes a light guide plate having a light incident edge and a top surface disposed to face a panel. A flexible printed circuit is provided to extend along one edge of the light guide plate. The flexible printed circuit consist of a body, and a mount portion at each of its two ends. The mount portion is substantially a V-arm with a coupling hole. A light source is mounted on the flexible printed circuit in a linear manner. And a mold frame has two couplers positioned at the same side of the flexible printed circuit for attaching the light source close to the light incident edge of the light guide plate by engaging the two coupler with the coupling holes.

In one embodiment of the invention, the V-arm of the flexible printed circuit has an opening directing towards the light guide plate. The distance between the two coupling holes is substantially smaller than that of the two couplers. Hence, when the coupling holes and the couplers are engaged, the V-arm will be slightly deformed. The deformation force is sufficient enough to push the light source close to the light incident edge of the light guide plate, thereby eliminating the gap between the light guide plate and the light source.

BRIEF DESCRIPTION OF THE DRAWINGS

The present invention will now be specified with reference to its preferred embodiment illustrated in the drawings, in which.

DESCRIPTION OF THE PREFERRED EMBODIMENTS

Figure 1:
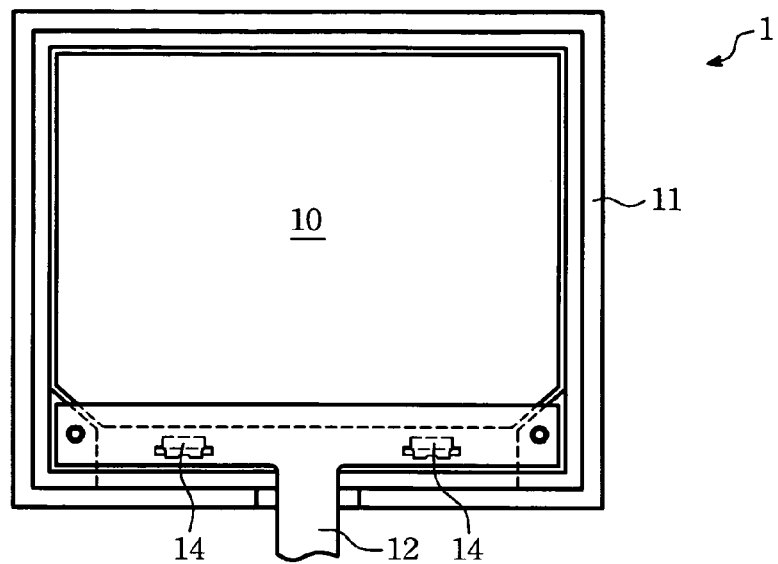
FIGS. 1A and 1B are top and cross-sectional views respectively of a conventional backlight assembly.
Figure 1:
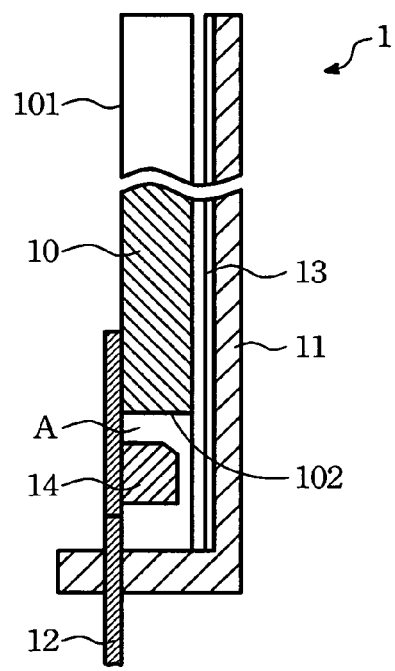
Figure 2A:
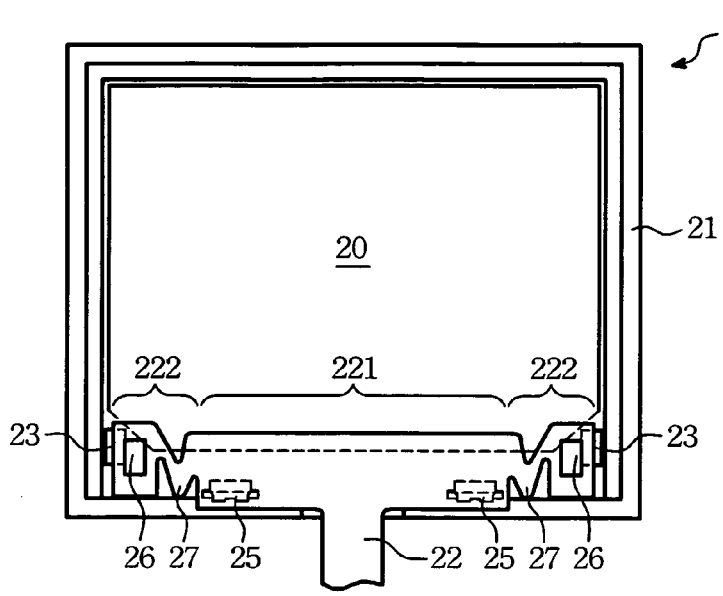
FIGS. 2A and 2B are top and cross-sectional views of a first embodiment of the backlight assembly of the invention.
Figure 2B:
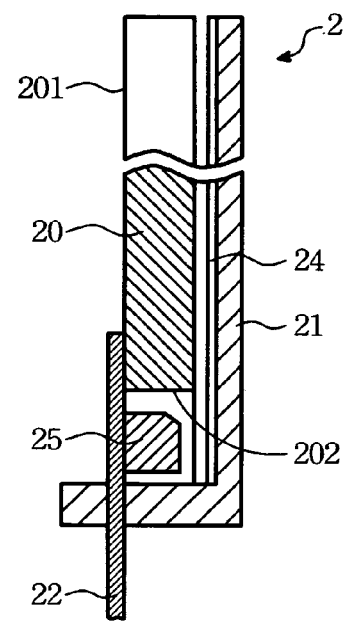

Refer to FIGS. 2A and 2B for a backlight assembly 2 according to a first preferred embodiment of the present invention. It includes a light source arranged in a linear manner, such as LED 25, a light guide plate 20, a mold frame 21 and a flexible printed circuit 22. The light source is mounted on the flexible printed circuit 22 in a linear manner for providing side light.

The light guide plate 20 is made from light translucent material, such as acrylic. It has a light exit surface 201 on the top side facing to a panel (not shown), and a light incident edge 202 on one side adjacent to the light source for guiding the light beam from light incident edge 202 to the panel via the light exit surface 201. To enhance the brightness, the reflector plate 24 is added at the bottom surface of the light guide plate 20.

The mold frame 21 has sidewalls for enclosing the flexible printed circuit 22, the light guide plate 20 and the LED 25. There are two couplers 23 integrally formed on the front surface of the mold frame 21 and close to the two ends of the flexible printed circuit 22 for engaging with the coupling holes 26.

Figure 2C:
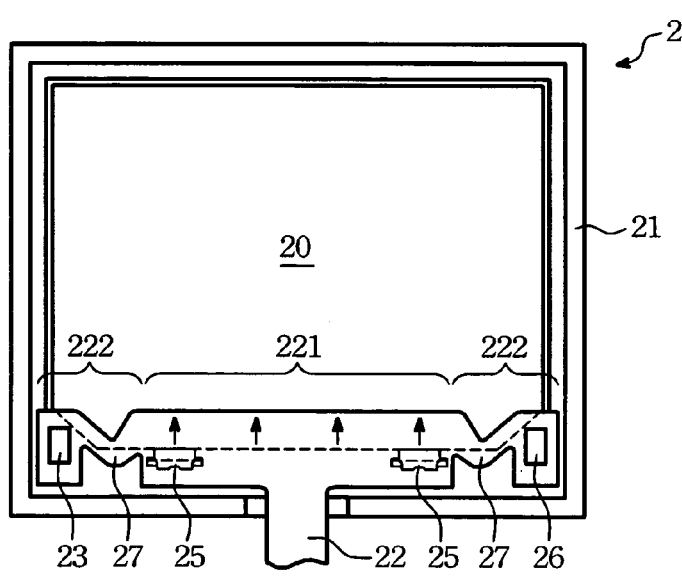
FIGS. 2C and 2D are top and cross-sectional views of the first embodiment.
Figure 2D:
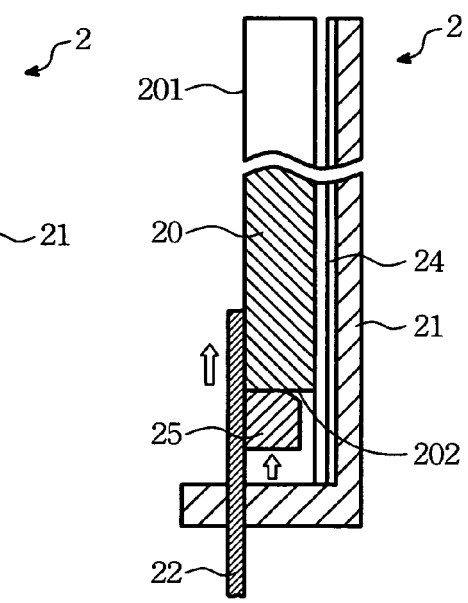

The flexible printed circuit 22 is extending along the light incident edge 202 of the light guide plate 20. The flexible printed circuit 22 has two portions, a body 221 and a mount portion 222. The body 221 of the flexible printed circuit 22 is coupled to the LED 25 for providing electric current. The mount portion 222 of the flexible printed circuit 22 is a substantially V-arm 27 with a coupling hole 26 at its two ends. The V-arm 27 is substantially "V" or "U" shaped with an opening towards the light guide plate 20. Moreover, the distance between the two coupling holes 26 is made slightly smaller than that of the two couplers 23. As a result, when the two coupling holes 26 are engaged with the two couplers 23, the flexible printed circuit 22 will be slightly deformed. The deformation of the flexible printed circuit 22 will generate a sufficient deformation force to push the body of the flexible printed circuit 22 close to the light incident edge 202 of the light guide plate 20. Consequently, the LED 25 will be attached to the light incident edge 202 of the light guide plate 20, thereby eliminating the gap between the light guide plate 20 and the LED 25 to increase light utilization as illustrated in FIGS. 2C and 2D.

Figure 3A:
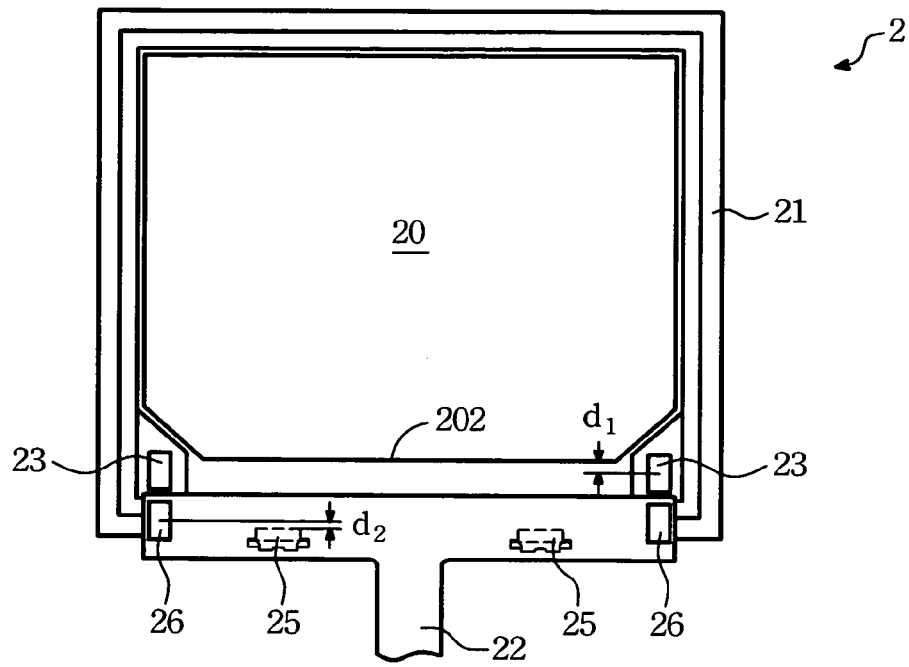
FIG. 3A is a schematic diagram showing the plane view of a second preferred embodiment of the backlight assembly of the invention.
Figure 3B:
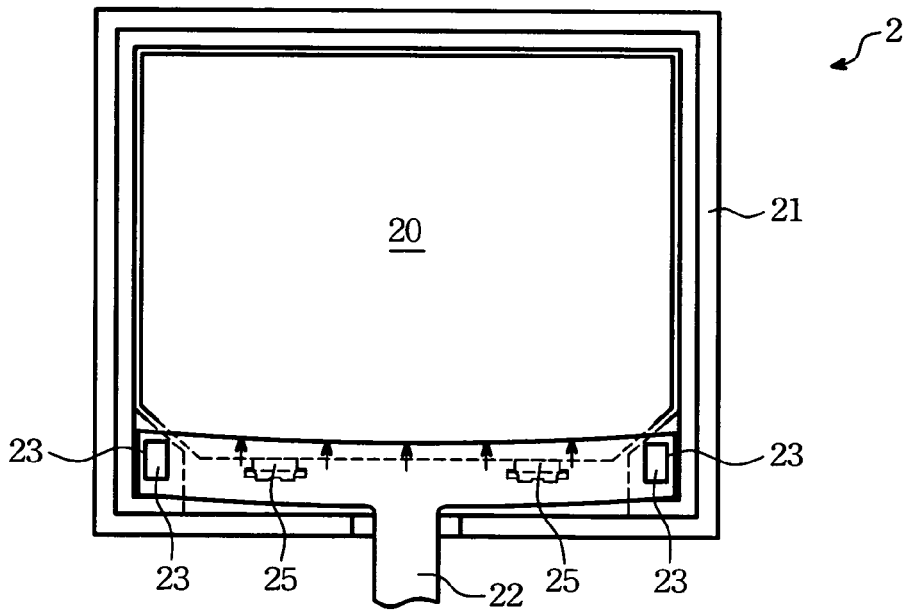
FIG. 3B is a schematic diagram showing the plane view of the second preferred embodiment of the backlight assembly of the invention.

Refer to FIGS. 3A and 3B for a second embodiment of the backlight assembly 2 of the present invention. The elements are substantially the same as those of the first preferred embodiment. The difference is mainly in the structure of the flexible printed circuit 22. In this embodiment, the distance d1 is measured from the center point of the couplers 23 to the light incident edge 202. The distance d2 is measured from the center point of the coupling hole 26 to the front end of the LED 25. Moreover, the distance d1 is smaller than d2. Hence, when the two coupling holes 26 and the two couplers 23 are engaged, the flexible printed circuit 22 will deform slightly and move the LED 25 closer to the light incident edge 202 of the light guide plate 20. Consequently, the gap between the light guide plate 20 and the LED 25 will be eliminated as illustrated in FIG. 3B.

Figure 4A:
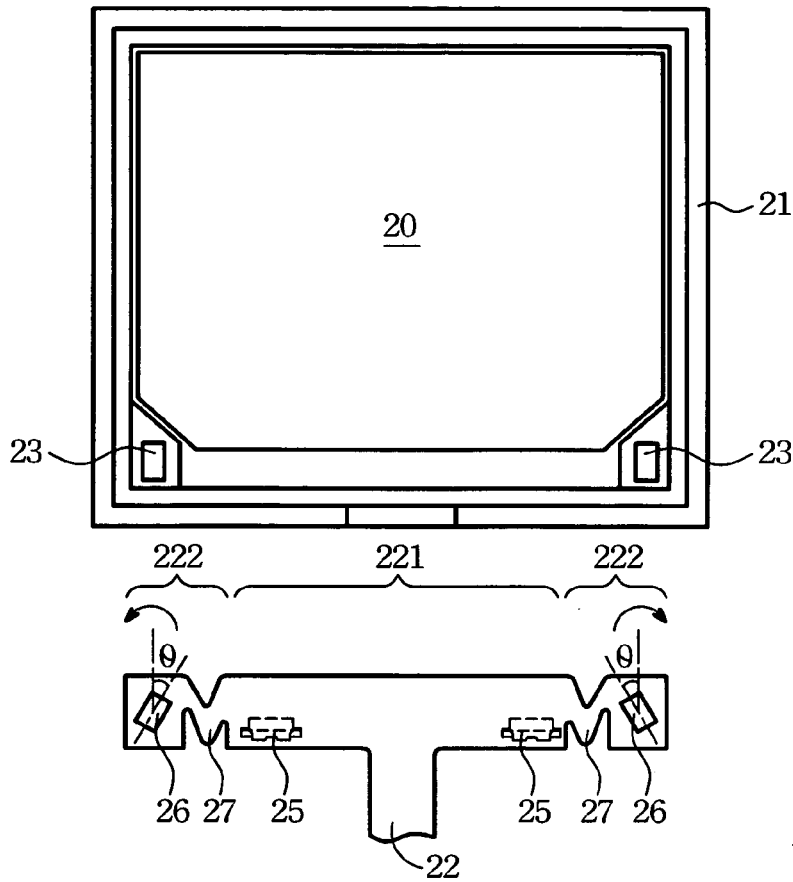
FIG. 4A is a schematic diagram showing the plane view of a third preferred embodiment of the backlight assembly of the invention before assembly.
Figure 4B:
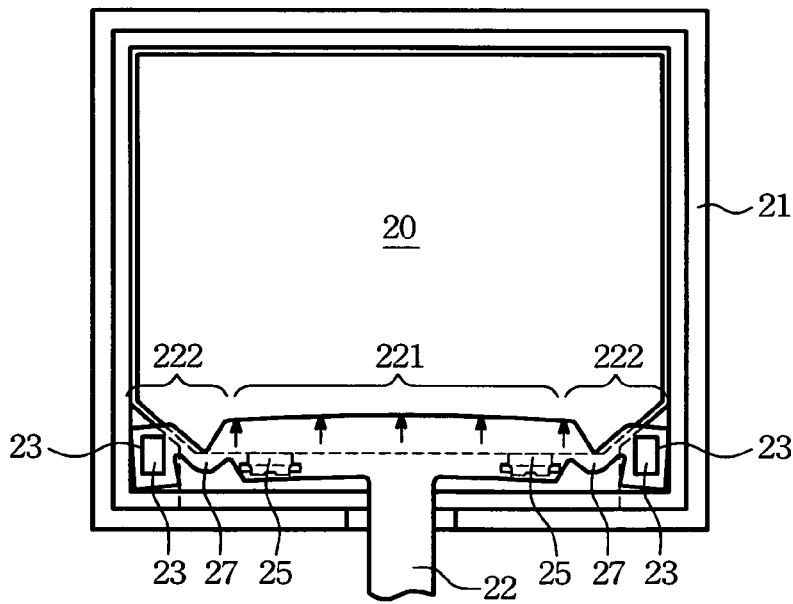
FIG. 4B is a schematic diagram showing the plane view of the third embodiment after assembly.

Refer to FIGS. 4A and 4B for a third preferred embodiment of the backlight assembly 2 of the present invention. The elements are substantially the same as the first preferred embodiment. The main difference is in the shape of the coupling holes 26. In this embodiment, the two couplers 23 are integrally formed on the mold frame 21 and substantially rectangular in shape. The flexible printed circuit 22 also has a body 221 and a mount portion 222 including a V-arm 27 and a coupling hole 26 at the two ends of the flexible printed circuit 22. The two coupling holes 26 of the flexible printed circuit 22 are correspondent rectangular-shaped. The couplers 23 and the coupling holes 26 are slightly inclined to each other, i.e. there is an angular offset between the coupler 23 and the corresponding coupling hole 26. Hence, the two coupling holes 26 have to be twisted in a selected angle θ for engaging with the two couplers 23. As a result, the body 221 of the flexible printed circuit 22 will bend towards the light guide plate 20 and move the LED 25 closer to the light incident edge 202 of the light guide plate 20 due to the deformation of the flexible printed circuit 22. Consequently, the gap between the light guide plate 20 and the LED 25 will be eliminated.

In summary, the three embodiments set forth above illustrate the mating conditions of the flexible printed circuit and the frame. By engaging the two coupling holes of the flexible printed circuit and the two couplers to generate deformation, the flexible printed circuit generates a deformation force to move the LED close to the light incident edge of the light guide plate and reduce the gap therebetween to improve light utilization.

While the preferred embodiments of the present invention have been set forth for the purpose of disclosure, modifications of the disclosed embodiments of the present invention as well as other embodiments thereof may occur to those skilled in the art. Accordingly, the appended claims are intended to cover all embodiments which do not depart from the spirit and scope of the present invention.

What is claimed is:

1. A backlight assembly for a hand-held liquid crystal display, comprising:
    a light guide plate having a light incident edge and a top surface disposed to face a panel;
    a flexible printed circuit extending along the light incident edge of the light guide plate, the flexible printed circuit consisting of a body, and a mount portion at each of its two ends, the mount portion being substantially a V-arm with a coupling hole;
    a light source mounted on the flexible printed circuit in a linear manner; and
    a mold frame having two couplers at its front surface and close to the coupling holes of the flexible printed circuit for attaching the light source close to the light incident edge of the light guide plate by engaging the two couplers with the coupling holes.

2. The backlight assembly for a hand-held liquid crystal display as claimed in claim 1, wherein the distance between the two coupling holes is substantially smaller than the distance between the two couplers.

3. The backlight assembly for a hand-held liquid crystal display of claim 1, further comprising:
    a reflector plate at a bottom surface of the light guide plate.

4. The backlight assembly for a hand-held liquid crystal display of claim 1, wherein the light source is a light emitting diode (LED).

5. A backlight assembly for a hand-held liquid crystal display, comprising:
    a light guide plate having a light incident edge and a top surface disposed to face a panel;
    a flexible printed circuit extending along the light incident edge of the light guide plate, the flexible printed circuit consisting of a body and a mount portion at each of its two ends, the mount portion having a V-arm with a coupling hole;
    a light source mounted on the flexible printed circuit in a linear manner; and
    a mold frame having two couplers at its front surface and close to the coupling holes of the flexible printed circuit for engagement, and the distance between the two coupling holes being substantially smaller than the distance between the couplers.

6. The backlight assembly for a hand-held liquid crystal display of claim 5, further comprising:
    a reflector plate at a bottom surface of the light guide plate.

7. The backlight assembly for a hand-held liquid crystal display of claim 5, wherein the light source is a light emitting diode (LED).

8. The backlight assembly for a hand-held liquid crystal display of claim 5, wherein the couplers are slightly inclined to the coupling holes.

9. The backlight assembly for a hand-held liquid crystal display of claim 8, wherein the couplers and the coupling holes are substantially rectangular in shape.

10. A backlight assembly for a hand-held liquid crystal display, comprising:

a light guide plate having a light incident edge and a top surface disposed to face a panel;

a flexible printed circuit extending along the light incident edge of the light guide plate, the flexible printed circuit consisting of a body and a mount portion at each of its two ends, the mount portion having a V-arm with a coupling hole;

a light source mounted on the flexible printed circuit in a linear manner; and a mold frame having two couplers at its front side and close to the coupling holes of the flexible printed circuit, and the distance between the two coupling holes being substantially smaller than the distance between the couplers for generating deformation force to attach the light source close to the light incident edge of the light guide plate by engaging the two couplers with the coupling holes.

11. The backlight assembly for a hand-held liquid crystal display of claim 10, further comprising:

a reflector plate at a bottom surface of the light guide plate.

12. The backlight assembly for a hand-held liquid crystal display of claim 10, wherein the light source is a light emitting diode (LED).

* * * * *